United States Patent [19]
Sullivan et al.

[11] Patent Number: 5,324,994
[45] Date of Patent: Jun. 28, 1994

[54] PEAK DETECTION CIRCUIT

[75] Inventors: Steven K. Sullivan; Joseph R. Peter, both of Beaverton, Oreg.

[73] Assignee: Tektronix, Inc., Wilsonville, Oreg.

[21] Appl. No.: 996,464

[22] Filed: Dec. 24, 1992

[51] Int. Cl.[5] .............................................. H03K 5/153
[52] U.S. Cl. ...................................... 307/351; 307/359
[58] Field of Search ....................... 307/351, 353, 359; 328/115, 116, 117, 151

[56] References Cited

U.S. PATENT DOCUMENTS

| | | | |
|---|---|---|---|
| 3,671,782 | 6/1972 | Wittlinger et al. | 307/353 |
| 4,086,651 | 4/1978 | Muir et al. | 307/351 |
| 4,209,717 | 6/1980 | Mahony | 307/353 |
| 4,271,488 | 6/1981 | Saxe . | |
| 4,370,620 | 1/1983 | Tin | 307/351 |
| 4,373,141 | 2/1983 | Sanders | 307/351 |

OTHER PUBLICATIONS

"Meeting 2-ns Pulse Capture Requirements", Nikkei Electronics, Oct. 7, 1985.

*Primary Examiner*—John Zazworsky
*Attorney, Agent, or Firm*—Boulden G. Griffith

[57] ABSTRACT

A CMOS-compatible peak detection circuit includes a differential amplifier stage (10), an active peak holding circuit (12), and a passive peak holding circuit (14). The differential amplifier stage (10) produces an amplifier output signal that is responsive to the difference between an input signal being monitored and feedback from the active peak holding circuit (12). Both the active peak holding circuit (12) and the passive peak holding circuit (14) store a charge representing a voltage level that is indicative of the peak amplitude of the amplifier output signal during a time interval, the time interval occurring while a disable signal is inactive. The active peak holding circuit (12) provides the maximum value signal as feedback to the differential amplifier stage (10). The passive peak holding circuit (14) provides a max signal output corresponding to the maximum value to a voltage follower stage (16) that makes it available as an output when a readback enable signal goes active. The active and passive peak holding circuits (12,14) are disconnected from the output of the differential amplifier stage (10) when a disable signal is active. A reset signal discharges capacitor storage (C1,C2) in the peak holding circuits (12,14) when it goes active. The readback enable and reset signals only go active during the time that the disable signal is active. To conserve power, a bias generation circuit (18) provides bias signals to the differential amplifier stage (10) enabling it to conduct only when the disable signal is inactive.

17 Claims, 9 Drawing Sheets

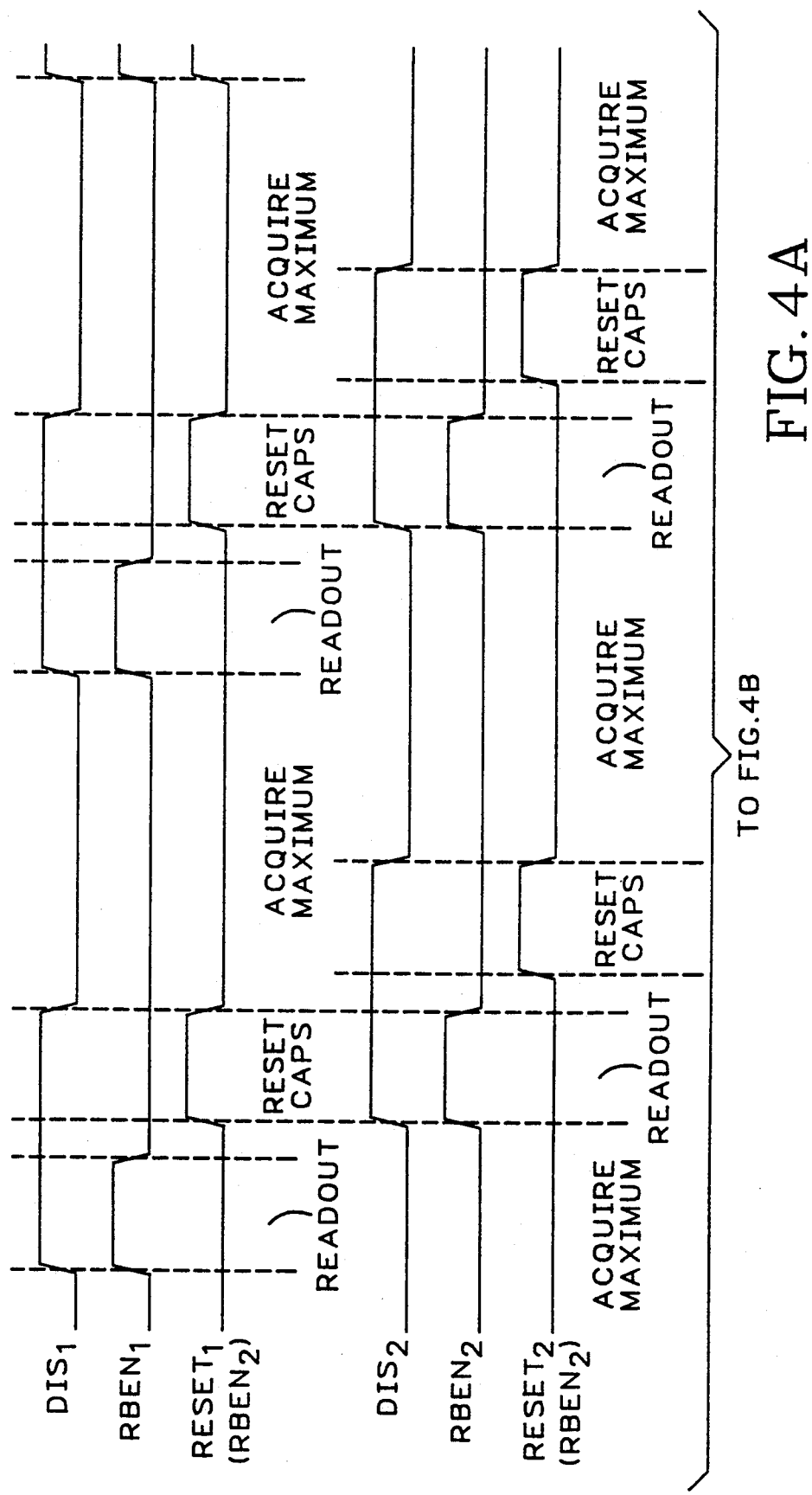

PEAK DETECTION CIRCUIT

BACKGROUND OF THE INVENTION

This invention relates to analog signal peak detection, and more particularly to an improved peak detection circuit for finding signal minimums and maximums of a signal during the intervals between successive samples in an analog data acquisition system, the improvement making the circuit suitable for implementation in Complementary Metal Oxide on Semiconductor (CMOS) transistor technology.

U.S. Pat. No. 4,271,488 to Saxe for a "High-Speed Acquisition System Employing an Analog Memory Matrix", hereby incorporated by reference, disclosed one version of a high speed analog data acquisition system. Co-pending patent application 07/589,222, now U.S. Pat. No. 5,144,525 by Saxe et al. for an "Analog Acquisition System Including a High Speed Timing Generator", hereby incorporated by reference, describes an improved analog signal acquisition system that is faster than the system described in the '488 patent.

Any method for determining the behavior of an analog signal that is based on sampling the signal at discrete intervals faces the fundamental issue of uncertainty as to the behavior of the signal between samples. The behavior of the signal between samples may nonetheless be of great interest, e.g., if there are glitches on the signal that are causing some sort of problem.

There are digital methods for finding the minimum and maximum behavior of an analog signal, but they also leave gaps between samples and the behavior of the signal within those gaps is still undetermined. However, if the signal can be sufficiently over sampled to ensure capture of the transient events of interest, relatively fleeting events can be captured.

In one of these digital methods, two registers are used to store the output of an analog-to-digital converter. A digital comparator monitors the contents of the two registers and retains, for example, the larger value, while enabling the other register to store the next incoming sample. For a "max" detector, the smaller sample is always discarded and the larger one retained. Thus, the largest value received so far is always saved in one register, while the other register is made available for storing the next incoming value. The result is that the largest value found during a sampling period ends up stored in one or the other of the two registers at the end of the period and that register is then selected for readout. Speed increases can be achieved by interleaving several such max (or min) monitors and selecting the most extreme of their outputs as the maximum-max at the end of the sampling period. However, for signals with very high frequency content sufficient over sampling is either technically infeasible or prohibitively expensive.

FIG. 1 shows a prior art analog peak detection circuit that has been used in analog data acquisition systems to determine signal minimums and maximums. A diode and capacitor are arranged to store the peak output of a differential amplifier whose inputs are the analog input signal to be monitored and the voltage level currently stored on the capacitor. A voltage following amplifier with high input impedance reproduces the voltage level stored on the capacitor as the circuit's output. Such an arrangement, including as it does the use of negative feedback, has been shown to be capable of producing a peak detector that has good linearity and a wide bandwidth when it is properly designed and fabricated using bipolar transistors. When two such circuits are used in alternation, one can be monitoring the signal while the other is being read out and cleared to prepare it for its turn at monitoring the signal.

Complementary Metal Oxide on Semiconductor (CMOS) transistor technology provides some advantages over bipolar transistor technology for some applications. In particular, circuitry implemented in CMOS is less expensive, more dense, and uses less power than comparable circuitry implemented in bipolar transistors. However, CMOS transistors are slower than bipolar ones, have lower gain, and must be configured differently in order to achieve linear high bandwidth operation.

Co-pending U.S. patent application 07/844,089 by Kogan for a "CMOS-Based Peak Detector for Fast-In, Slow-Out Min/Max Detection", hereby incorporated by reference, discloses several approaches to min/max peak detection that utilize CMOS circuitry. These approaches produce less than ideal results because diode substitutes implemented in CMOS do not perform like ideal diodes, and this causes input signal and time dependent inconsistencies in the performance of the circuit.

An ideal diode conducts only when the voltage across it is greater than a conduction threshold, and does not conduct at all when the applied voltage is less than that amount. Less than ideal diodes, including diode substitutes implemented in CMOS, continue to conduct, but in decreasing amounts, as the voltage across them is decreased, instead of having a sharp cutoff at a specific voltage. This means that the stored maximum voltage can continue to change over the sample interval, with the change being a function of both the voltage across the "diode" and the duration of the time that it is present. This also leads to the partial loss of small fast signals, which may not cause sufficient "diode" conduction to be detected, or which may be swamped by time and signal dependent leakage effects. A CMOS-compatible approach to peak detection that successfully avoids these time and signal dependencies is therefore needed.

The circuits shown in the Kogan 07/844,089 application also introduce a non-linearity into the peak detection process. It would also be desirable to eliminate such non-linearities to the maximum extent possible, even though they can be compensated for by the addition of linearizing means in the downstream signal path.

SUMMARY OF THE INVENTION

In accordance with the invention, a CMOS-compatible peak detection circuit includes a differential amplifier stage, an active peak holding circuit, and a passive peak holding circuit. The differential amplifier stage produces an amplifier output signal output that is responsive to the difference between an input signal and feedback from the active peak holding circuit. Both the active peak holding circuit and the passive peak holding circuit monitor the amplifier output signal and store a maximum value that corresponds to the peak amplitude of the amplifier output signal during a time interval while a disable signal is inactive. The active peak holding circuit provides the feedback signal maximum value to the differential amplifier stage. The passive peak holding circuit provides a max signal output corresponding to the maximum value signal to a voltage follower stage which in turn provides it as an output node of the overall circuit when a readback enable signal goes active. The active and passive peak holding circuits are disconnected from the output of the differential amplifier stage when a disable signal is active. A reset signal discharges storage capacitors in the peak holding circuits when it goes active. The readback enable and reset signals only go active during the time that the disable signal is active. To conserve power, a bias generation circuit provides bias signals to the differential amplifier stage so that it is enabled to conduct only when the disable signal is inactive.

BRIEF DESCRIPTION OF THE DRAWINGS

FIG. 4A and 4B are is a timing diagram illustrating the operation of the circuits shown in FIGS. 3 and 7.

DETAILED DESCRIPTION

Figure 1:
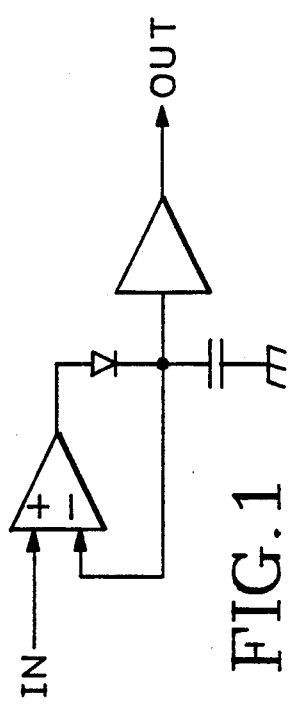
FIG. 1 is a schematic diagram of a prior art peak detector.
Figure 2:
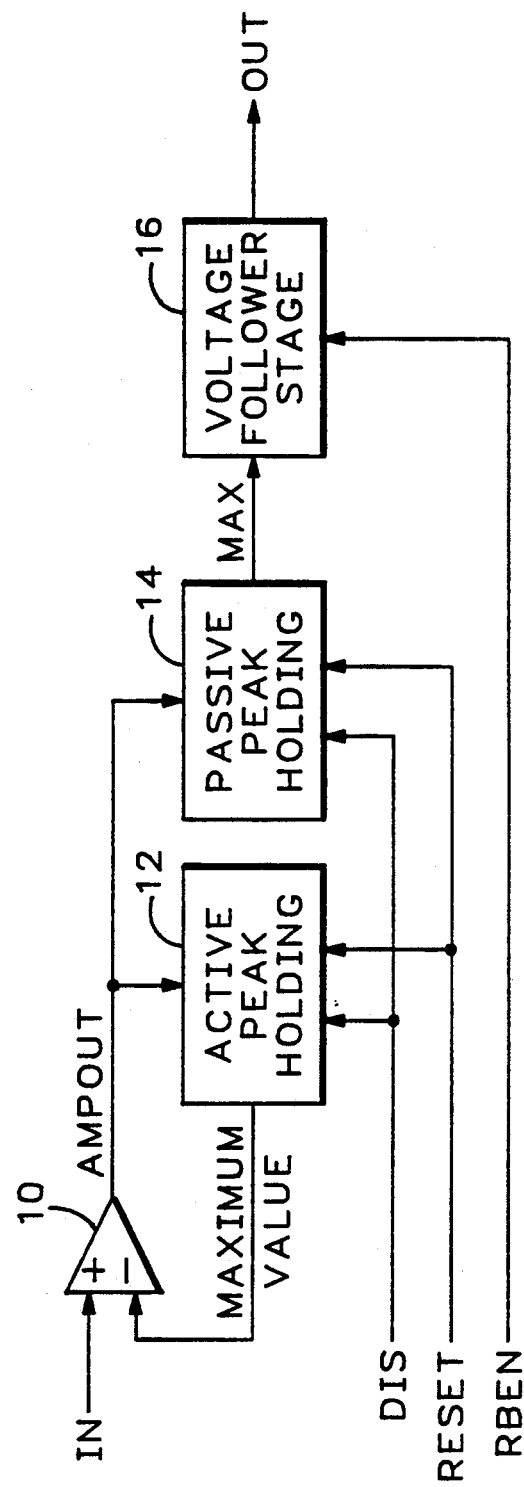
FIG. 2 is a block diagram of a CMOS-compatible peak detection circuit according to the present invention.

FIG. 2 shows a block diagram of the CMOS-compatible peak detection circuit according to the present invention. A differential amplifier stage 10 receives at its input an analog signal, IN, to be monitored for a maximum signal level. The output of the differential amplifier stage 10 is an AMPOUT signal that is input to active peak holding circuit 12 and passive peak holding circuit 14. The active and passive peak holding circuits 12 and 14 also each receive two control signals, DIS (disable) and RESET. The active peak holding circuit 12 provides a MAXIMUM VALUE signal as feedback to the differential amplifier stage, while the passive peak holding circuit 14 provides a MAX signal output (corresponding to the maximum value) to a voltage follower stage 16.

Figure 3:
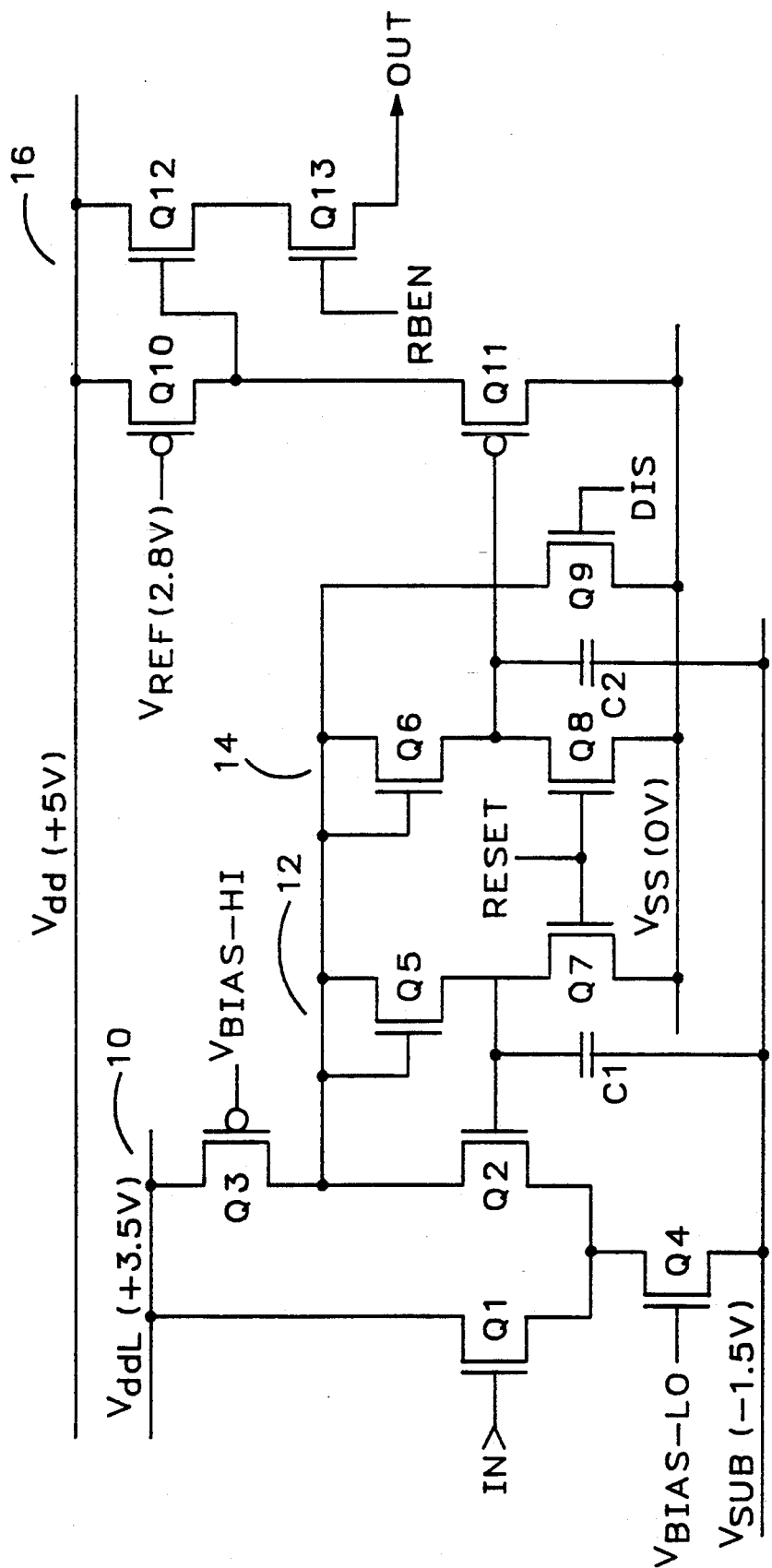
FIG. 3 is a schematic diagram of the peak detection circuit shown in FIG. 2.

FIG. 3 shows in schematic form the component level details of the blocks shown in FIG. 2. The differential amplifier stage 10 consists of NMOS transistors Q1, Q2, and Q4, and PMOS transistor Q3. The active peak holding circuit 12 consists of NMOS transistors Q5 and Q7, and capacitor C1. The passive peak holding circuit 14 consists of NMOS transistors Q6 and Q8, and capacitor C2. The input to both of these circuits is forced low by NMOS transistor Q9 under the control of the DIS (disable) signal. The voltage follower stage 16 consists of PMOS transistors Q10 and Q11 and NMOS transistors Q12 and Q13.

The IN signal is applied to the gate of Q1, which is one side of differential pair Q1 and Q2. The sources of differential pair Q1,Q2 are connected to the drain of current sink transistor Q4, which is under the control of a low bias voltage, $V_{BIAS-LO}$. The drain of Q1 is connected directly to $V_{ddL}$, a +3.5V supply. The drain of Q2 is connected to $V_{ddL}$ through PMOS current source transistor Q3, the gate of which is under the control of a high bias voltage, $V_{BIAS-HI}$. The output of the differential amplifier stage 10, AMPOUT, is taken from the node between the drain of Q3 and the drain of Q2.

The output of the differential amplifier stage 10 is connected to both the gates and the drains of transistors Q5 and Q6, and to the drain of Q9. The source of Q9 is connected to $V_{SS}$ and its gate is controlled by DIS (disable). The source of transistor Q5 is connected to the drain of transistor Q7, to the gate of transistor Q2, and to capacitor C1, the other side of which is connected to $V_{SUB}$ (−1.5V). The source of transistor Q6 is connected to the drain of transistor Q8, to the gate of transistor Q11, and to capacitor C2, the other side of which is also connected to $V_{SUB}$. The gates of transistors Q7 and Q8 are both controlled by the signal RESET, and both of their sources are connected to $V_{SS}$ (0V).

The gate of Q11 is the input to the voltage follower stage 16. The drain of Q11 is connected to $V_{SS}$, and its source is connected to the drain of transistor Q10 and to the gate of transistor Q12. Both the source of PMOS transistor Q10 and the drain of NMOS transistor Q12 are connected to $V_{dd}$. The gate of transistor Q10 is controlled by the 2.8V reference voltage $V_{REF}$. The source of transistor Q12 is connected to the drain of transistor Q13. The source of Q13 is the output of the overall circuit, OUT. The gate of Q13 is controlled by the readback enable signal, RBEN.

Figure 4B:
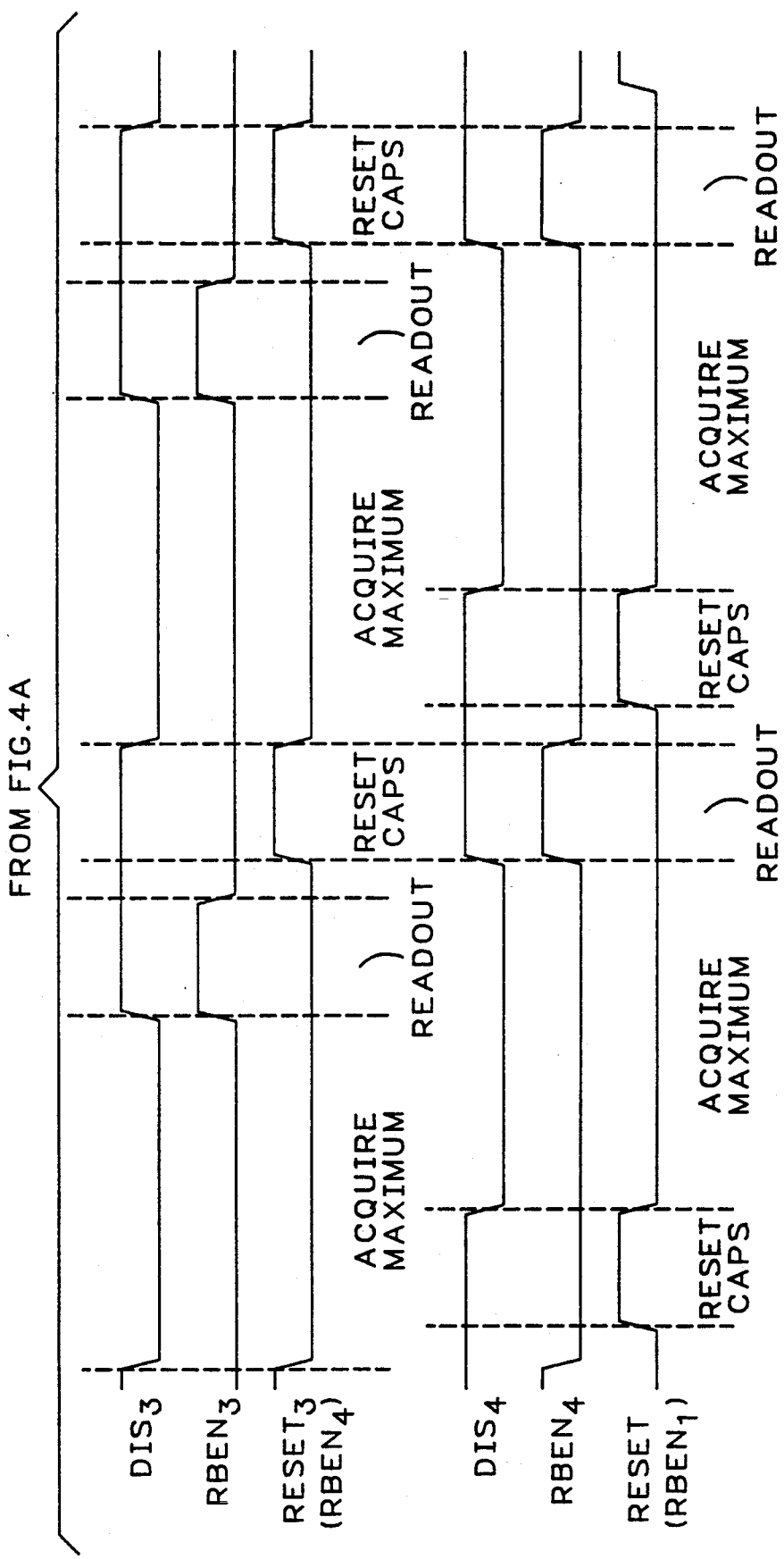
Figure 6:
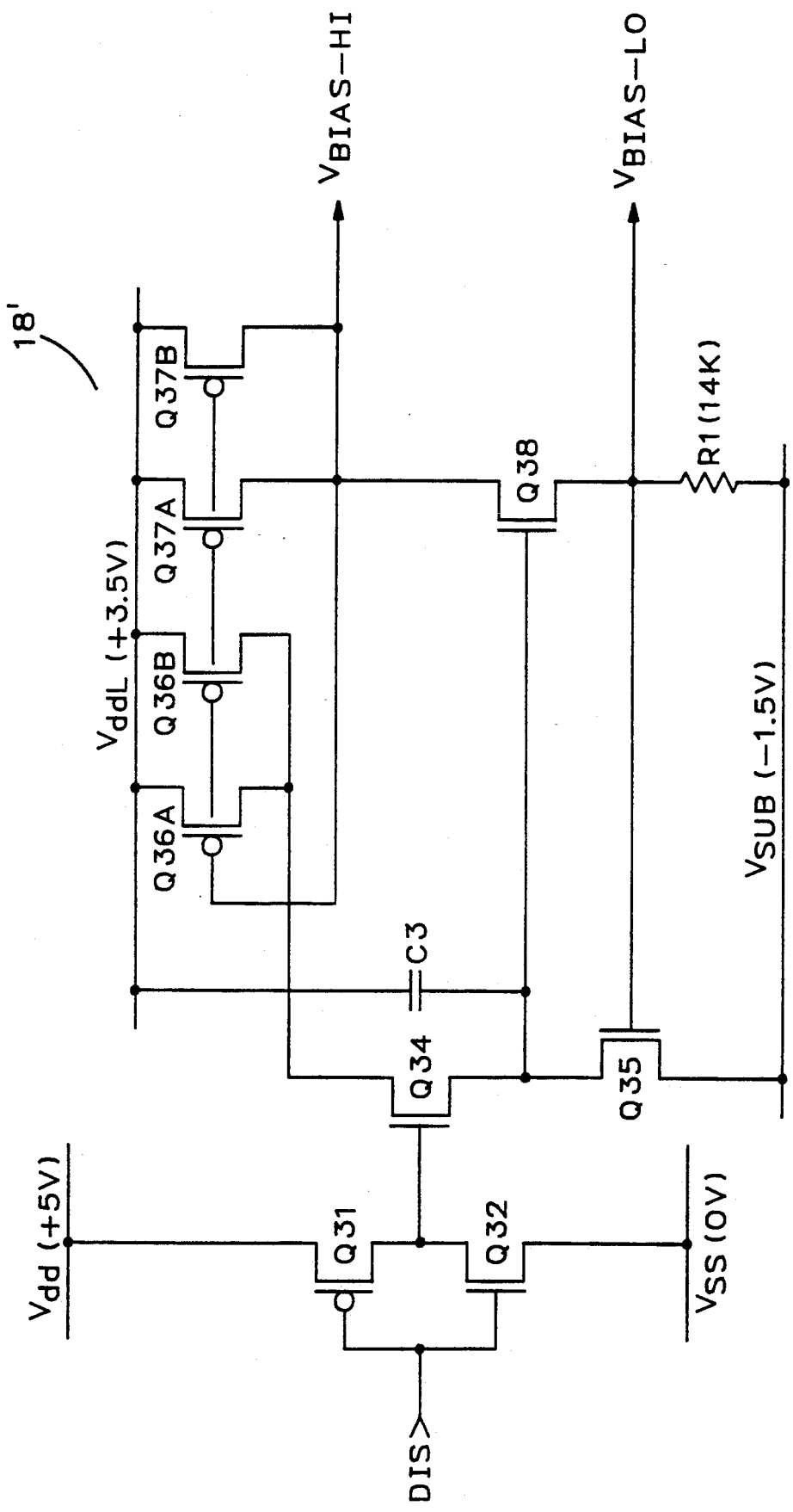
FIG. 6 is a schematic diagram of a preferred embodiment of the bias voltage generator suitable for use with the peak detector of the present invention.

FIG. 4 is a timing diagram which illustrates the operation of the circuit shown in FIG. 3, as well as the system circuit shown in FIG. 6. Referring now to the top portion of FIG. 4 in conjunction with FIG. 3, during a readout interval the DIS (disable) and RBEN (readback enable) signals go high at the same time, while the RESET signal goes low. The high level of DIS causes NMOS transistor Q9 to conduct, thereby connecting the drains of Q3, Q2, Q5 and Q6, as well as the gates of Q5 and Q6, to $V_{SS}$. This has the effect of shutting off Q5 and Q6 and completely disconnecting and isolating C1 and C2 from any activity of the AMPOUT signal from the differential amplifier stage 10 during this interval, thereby preventing any perturbation of the voltage levels stored on them during the readout process.

During this readout interval, the high on RBEN causes Q13 to conduct, thereby connecting its drain to its source, where the OUTput is taken from the circuit. The voltage level at the drain of Q13 is approximately the same as the voltage level at the gate of Q11, because the threshold offset from the gate to the source of PMOS transistor Q11 is canceled by the gate to the source threshold offset of NMOS transistor Q12. Thus, the source of Q12 and the drain of Q13 always are tracking the voltage level present on C2 of the passive peak holding circuit, and that voltage value is further presented to the OUTput while RBEN is high.

When the readback enable signal RBEN goes low, the OUTput is disconnected from the activity of C2. After a brief interval to be further described below, RESET goes high turning on NMOS transistors Q7 and Q8. This causes capacitors C1 and C2 to discharge to the level of $V_{SS}$. This resetting of the active and passive peak holding circuits 12 and 14 occurs while they are disconnected from the differential amplifier stage 10 by the high state of the DIS signal and while they are disconnected from the OUTput by the low state of the RBEN signal.

At the end of the reset interval both the DIS and RESET signals go low and the acquire maximum interval begins. The low level of DIS turns off NMOS transistor Q9, thereby permitting the node connected to its drain to be controlled by the output of the differential amplifier stage 10. The low level of the RESET signal turns off NMOS transistors Q7 and Q8, thereby isolating the nodes on their drains from $V_{SS}$ and putting the capacitors C1 and C2 under the control of the AMP-OUT output of the differential amplifier stage 10 via the operation of diode-connected NMOS transistors Q5 and Q6. During the acquisition interval, upward excursions of the voltage present on the INput signal that exceed the voltage level of the MAXIMUM VALUE signal are transmitted by the AMPOUT signal through the differential amplifier stage 10 and diode-connected transistors Q5 and Q6 to capacitors C1 and C2, respectively. The charge on C1 controls the gate of Q2 to balance the current through the differential amplifier stage 10 and cause the voltage on the drain of Q2 to track the IN signal on the gate of Q1. Downward voltage excursions of the INput signal are not tracked by C1 and C2 because of the diode operation of diode-connected transistors Q5 and Q6.

At the end of the maximum acquisition interval, DIS and RBEN again go high disconnecting the active and passive peak holding circuits 12 and 14 from differential amplifier stage 10 and enabling the readout through the voltage follower stage 16 of the voltage stored on C2.

As was noted above, the active peak holding circuit 12 and the passive peak holding circuit 14 are isolated from each other, and yet they each track and reproduce the amplifier output voltage level output of the differential amplifier stage 10. The isolation between the active peak holding circuit 12 and the passive peak holding circuit 14 ensures that leakage due to capacitive coupling between the gate and drain of Q2 does not affect the charge on C2 even if does cause the charge on C1 to be compromised.

Since the active peak holding circuit 12 provides the MAXIMUM VALUE feedback signal to the differential amplifier stage 10 while the passive peak holding circuit 14 produces the MAX signal that is fed forward to the voltage follower stage 16, it is important that these two circuits have very similar responses to their inputs. The most important parameter in this regard is the ratio of the resistance provided by the diode-connected transistors Q5 and Q6 to the capacitance provided by the capacitors C1 and C2.

Figure 5:
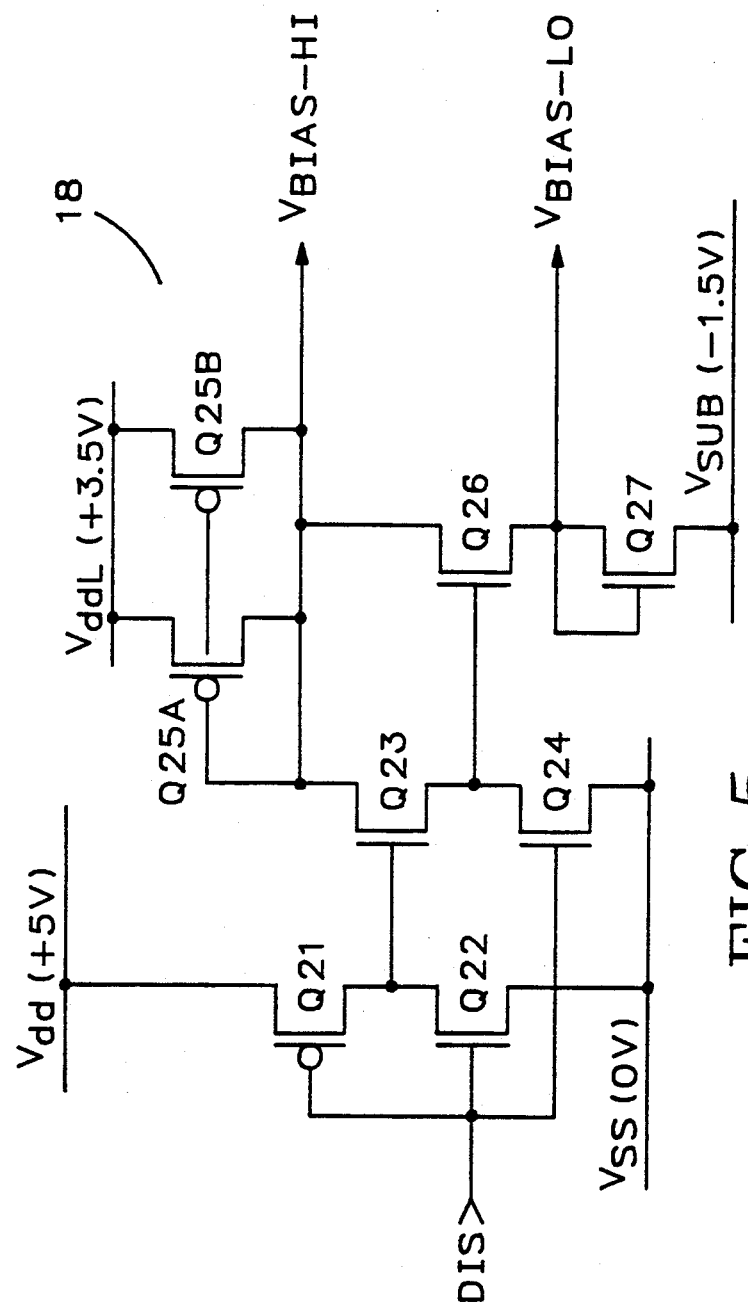
FIG. 5 is a schematic diagram of a bias voltage generator suitable for use with the peak detector of the present invention.

Referring to first to FIG. 3 and then to FIG. 5, the current source transistor Q3 ideally produces a current that is one half of the current through the current sink transistor Q4, so that the currents through the two sides of the differential amplifier stage 10 are balanced in the absence of an input signal. The bias generator 18 that produces the bias voltages $V_{BIAS-HI}$ and $V_{BIAS-LO}$ to control these current sources is shown in detail in FIG. 5. The bias voltages produced by this circuit inactivate the differential amplifier stage 10 of the circuit shown in FIG. 3 while DIS is low, and activate it while DIS is high.

The bias generator 18 receives the DIS signal at the gates of three transistors, a PMOS transistor Q21 and two NMOS transistors Q22 and Q24. The source of Q21 is connected to $V_{dd}$ and its drain is connected to the drain of Q22 and to the gate of another NMOS transistor, Q23. The sources of Q22 and Q24 are connected to $V_{SS}$, while the drain of Q24 is connected to the sourc of Q23. The drain of Q23 is connected to both the gates and drains of two additional diode-connected PMOS transistors Q25A and Q25B, to the drain of another NMOS transistor Q26, and to the $V_{BIAS-HI}$ output of the bias generator 18. The gate of Q26 is connected to the drain of Q24 and to the source of Q23. The source of Q26 is connected to both the drain and the gate of Q27, and to the $V_{BIAS-LO}$ output of the bias generator 18. The source of Q27, another NMOS transistor, is connected to $V_{SUB}$.

During the times that DIS is high PMOS transistor Q21 is non-conducting and NMOS transistors Q22 and Q24 are conducting. With Q21 acting as an open switch and Q22 acting as a closed switch, the gate of Q23 is pulled low causing it to act as an open switch. And, with Q24 closed and Q23 open, the gate of Q26 is also pulled low so that it acts as an open. With Q26 open, the drain and gate of diode-connected transistor Q27 float at a voltage that is one threshold above $V_{SUB}$ and Q27 is non-conducting. The negligible current through Q27 is mirrored by a negligible current through Q4 (FIG. 3). Also, with Q23 and Q26 open, the drains and gates of diode-connected PMOS transistors Q25A and Q25B float at a voltage that is one threshold below $V_{ddL}$ and these transistors are only minimally conducting. And again, the current through these transistors is replicated by the current through Q3 (FIG. 3).

When DIS goes low, Q21 conducts and acts as a closed switch, while Q22 and Q23 turn off and act as open switches. With Q21 closed and Q22 open, the gate of Q23 is pulled high and Q23 conducts. Since Q24 is also open, the closed state of Q23 acts to connect the drain of Q26 to its gate, thereby temporarily putting it in a diode-connected state. Since Q25A and Q25B and Q27 are permanently in a diode-connected state, three diode-connected transistor configurations are now connected in series between $V_{ddL}$ and $V_{SUB}$. And since the voltage between $V_{ddL}$ and $V_{SUB}$ (5V) exceeds the voltage drop normally associated with three threshold drops, the relative resistances of the channels of the three transistors will determine how much of the excess voltage is dropped where. As can be seen from Tables I, Transistor Channel Dimensions (below), and bearing in mind that the resistance associated with PMOS transistors is about three thimes higher than that for equal geometry NMOS transistors, it can be seen that channel of Q26 presents a significantly higher resistance than do the channels of Q25A,Q25B or Q27, and that therefore the majority, but not all, of the excess voltage is dropped across Q26. In this condition, the current through Q27 is the sum of the currents through Q25A and Q25B, and the current through Q4 (FIG. 3) is the same as the current through Q27, while the current through Q3 (FIG. 3) is equal to the current through one or the other of Q25A or Q25B which is equal to one half of the current through Q27. Since the transistors which set the currents through Q3 and Q4 are built by the same process that builds transistors Q25A, Q25B, and Q27, process and global temperature variations do not affect the desired 2:1 ratio between these currents. (Temperature gradients can still cause some variation in the 2:1 ratio.)

Table I provides the channel dimensions used for each of the transistors shown in FIGS. 2 and 4 when the circuit shown in FIG. 3 is used in conjunction with the circuit shown in FIG. 5.

TABLE I

TRANSISTOR CHANNEL DIMENSIONS ($\mu$m)

| Q# | Width | Length | Q# | Width | Length |
|---|---|---|---|---|---|
| Q1 | 16.8 | 2.2 | Q12 | 38.4 | 2.2 |
| Q2 | 16.8 | 2.2 | Q13 | 19.2 | 1.0 |
| Q3 | 9.6 | 1.0 | Q21 | 2.4 | 1.0 |
| Q4 | 7.8 | 1.0 | Q22 | 2.4 | 1.0 |
| Q5 | 4.8 | 1.0 | Q23 | 2.4 | 1.0 |
| Q6 | 4.2 | 1.0 | Q24 | 2.4 | 1.0 |
| Q7 | 4.8 | 1.0 | Q25A | 9.6 | 1.0 |
| Q8 | 2.4 | 1.0 | Q25B | 9.6 | 1.0 |
| Q9 | 2.4 | 1.0 | Q26 | 4.8 | 1.0 |
| Q10 | 4.8 | 1.0 | Q27 | 7.8 | 1.0 |
| Q11 | 4.8 | 1.0 | | | |

(All width values above 5 $\mu$m are actually implemented using multiple parallel transistors.)

While the circuit shown in FIG. 5 produces correct ratios between currents, the absolute values of currents that it produces vary significantly with temperature and process variations. A superior bias generator 18' that produces currents that are much less sensitive to temperature and process is shown in FIG. 6. In this bias generator 18', the DIS signal controls the gates of PMOS transistor Q31 and NMOS transistor Q32, so that an inverted version of DIS is applied to the gate of NMOS transistor Q34. The source of Q34 is connected to the drain of Q35, the gate of NMOS transistor Q38, and to one plate of a capacitor C3, the other plate of which is connected to $V_{ddL}$. (Capacitor C3 is implemented as a PMOS transistor with its gate connected to the source of Q34 and both its source and drain connected to $V_{ddL}$.) The source of Q35 is connected to the substrate voltage, $V_{SUB}$ ($-1.5V$). The gate of Q35 is connected to the source of Q38 and to one end of a resistor R1 whose other end is connected to $V_{SUB}$, and is also connected to the $V_{BIAS-LO}$ output of the bias generator. The drain of Q38 is connected to the drains of PMOS transistors Q37A and Q37B and is also connected to the gates of PMOS transistors Q36A, Q36B, Q37A, and Q37B, and is also the $V_{BIAS-HI}$ output of the bias generator. The drains of Q36A and Q36B are connected to the drain of NMOS transistor Q34, while their sources and the sources of Q37A and Q37B are connected to $V_{ddL}$.

Referring still to FIG. 6, when DIS is high Q31 is turned off and Q32 is turned on, thereby connecting the gate of Q34 to $V_{SS}$. The low on the gate of Q34 turns it off and thereby stops current flow through the Q36A/Q36B leg of the current mirror formed by Q36A, Q36B, Q37A, and Q37B. When Q34 is turned off its source goes to $-V_{THRESHOLD}$ and that voltage on the gate of Q38 also shuts off the current through the Q37A/Q37B leg of the current mirror. Under these conditions, $V_{BIAS-HI}$ goes to $V_{ddL}$ and $V_{BIAS-LO}$ goes to $V_{SUB}$.

When DIS is low and the differential amplifier stage 10 of the peak detector is to be turned on, the low input on its gate turns PMOS transistor Q31 on and NMOS transistor Q32 off. The resulting high on the gate of Q34 turns it on, and with it on current flows through Q35 and through Q36A and Q36B. Current then also flows through the other side of the current mirror, Q37A and Q37B, and through Q38 and R1. The current flowing in each side of this circuit is approximately equal to the threshold voltage of Q35 divided by the value of R1. As in the operation of the other bias generator, the current through Q4 (FIG. 3) will be equal to the current through Q35 and the sum of the currents through Q36A and Q36B or Q37A and Q37B, while the current through Q3 (FIG. 3) will be equal to one half of that current. The main difference now being that the absolute amount of that current is more closely controlled and less sensitive to temperature and process variations. Capacitor C3 compensates for excess gain at some frequencies which might otherwise cause ringing or longer lasting oscillations.

Table II below provides the channel dimensions used for each of the transistors shown in FIGS. 2 and 5 when the circuit shown in FIG. 3 is used in conjunction with the circuit shown in FIG. 6.

TABLE II

TRANSISTOR CHANNEL DIMENSIONS ($\mu$m)

| Q# | Width | Length | Q# | Width | Length |
|---|---|---|---|---|---|
| Q1 | 16.8 | 2.2 | Q12 | 38.4 | 2.2 |
| Q2 | 16.8 | 2.2 | Q13 | 19.2 | 1.0 |
| Q3 | 19.2 | 2.2 | Q31 | 2.4 | 1.0 |
| Q4 | 19.2 | 2.2 | Q32 | 2.4 | 1.0 |
| Q5 | 4.8 | 1.0 | Q34 | 9.6 | 1.0 |
| Q6 | 4.2 | 1.0 | Q35 | 19.2 | 2.2 |
| Q7 | 4.8 | 1.0 | Q36A | 19.2 | 2.2 |
| Q8 | 2.4 | 1.0 | Q36B | 19.2 | 2.2 |
| Q9 | 2.4 | 1.0 | Q37A | 19.2 | 2.2 |
| Q10 | 4.8 | 1.0 | Q37B | 19.2 | 2.2 |
| Q11 | 4.8 | 1.0 | Q38 | 9.6 | 1.0 |

(All width values above 5 $\mu$m are actually implemented using multiple parallel transistors.)

Since a high DIS signal disables the bias generator 18 and the differential amplifier stage 10, current is conserved when the peak detector is not in operation. Moreover, since these bias voltages take the differential amplifier 10 stage from a non-conducting state to a conducting state in a predictable fashion that does not introduce any spurious maximum indications, the results obtained are not compromised as they might be by a more abrupt start up. This gradual start up of the peak detection circuitry means that there is a brief interval after DIS goes low before the peak detection circuitry is fully operational, but this can be compensated for at the system level, as will be more fully explained below.

Figure 7:
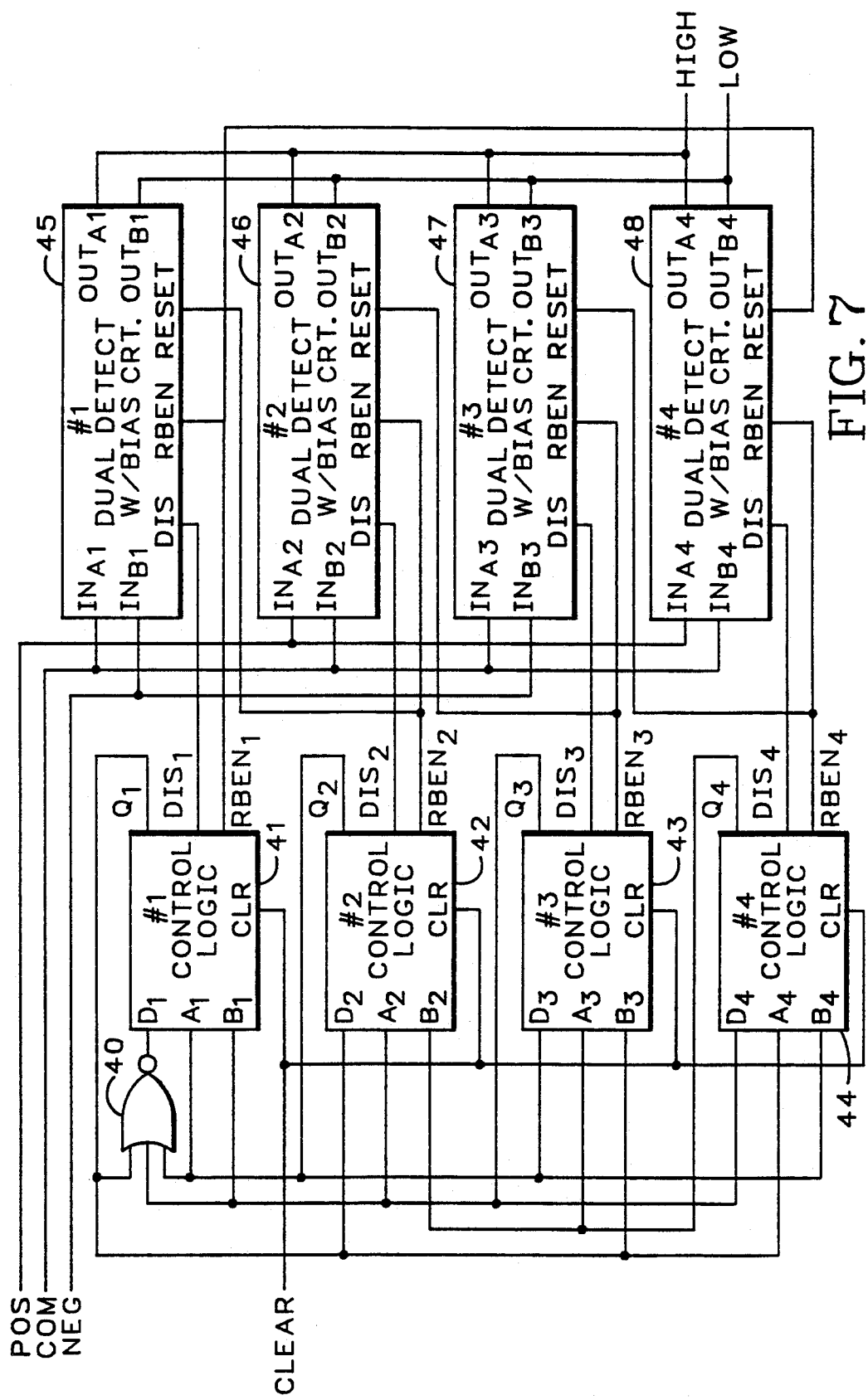
FIG. 7 is a block diagram of a MIN/MAX detection system circuit employing a plurality of CMOS-compatible peak detection circuits according to the present invention.

Referring now to FIG. 7, eight of the peak detection circuits shown in FIG. 3 can be configured into a system for continuous detection of analog signal minimums and maximums, as shown in this figure. Four Dual Detect w/ Bias Circuits 45-48 collectively monitor continuously three signal lines, POS, COM, and NEG, which respectively represent the positive, common mode, and negative signal lines associated with an input signal. The #1 Dual Detect w/ Bias Circuit 45 receives the COM signal at its input $IN_{A1}$ and the NEG signal at its input $IN_{B1}$. The #2 Dual Detect w/ Bias Circuit 46 receives the POS signal at its input $IN_{A2}$: and the COM signal at its input $IN_{B2}$. The #3 Dual Detect w/ Bias Bias Circuit 47 receives the COM signal at its input $IN_{A3}$ and the NEG signal at its input $IN_{B3}$. The #4 Dual Detect w/ Bias Circuit 48 receives the POS signal at its input $IN_{A4}$ and the COM signal at its input $IN_{B4}$. The $OUT_{Ax}$ outputs of all four Dual Detect w/ Bias Circuits 45-48 are connected to a HIGH output line, while the $OUT_{Bx}$, outputs of all four circuits are connected to a LOW output line.

Each Dual Detect w/ Bias Circuit 45-48 also receives three control inputs, DIS, RBEN, and RESET, the functions of which were discussed above in connection with FIGS. 2, 4, and 5. Control Logic circuits 41-44 supply DIS and RBEN signals to their associated (equivalently numbered, #1-#4) Dual Detect w/ Bias Circuits 45-48. The RESET signal for each Dual Detect w/ Bias Circuit 45-48 is the RBEN signal from the Control Logic circuit 41-44 associated with the next-numbered Dual Detect w/ Bias Circuit 45-48, as is shown in parentheses at the left side of FIG. 4.

Each Control Logic circuit 41-44 has A, B, D, and CLEAR inputs, and produces a $Q_x$ output in addition to the DIS and RBEN outputs previously discussed. The $Q_1$ output of the #1 Control Logic circuit 41 is the $D_2$ input to the #2 Control Logic circuit 42, the $B_3$ input to the #3 Control Logic circuit 43, and the $A_4$ input to the #4 Control Logic circuit 44. $Q_2$ is connected to $D_3$, $B_4$, and $A_1$, and to a NOR gate 40 whose output is connected to $D_1$. Similarly, $Q_3$ is connected to $D_4$, $B_1$, $A_2$, and to another of the inputs of NOR gate 40. And, finally, $Q_4$ is connected (only) to $B_2$ and $A_3$. Note that, with the exception of $D_1$, each $D_x$ input comes from the $Q_{x-1}$ output of the preceding Control Logic circuit. Also note that $D_1$'s input from NOR gate 40 will go active when $Q_1$, $Q_2$, and $Q_3$ are low, which is the same time that $Q_4$ is high, so that it is as if $D_1$ received its input directly from $Q_4$. Thus, the control inputs to the four Dual Control w/ Bias Circuits 45-48 vary systematically in a rotating four-phase relationship, as can be seen by examination of FIG. 4. NOR gate 40 acts to start this four phase rotating relationship with an active high input to $D_1$ of the #1 Control Logic circuit 41 after a CLEAR signal has caused the $Q_x$ outputs of all of the Control Logic circuits 41-44 to go low.

Figure 8:
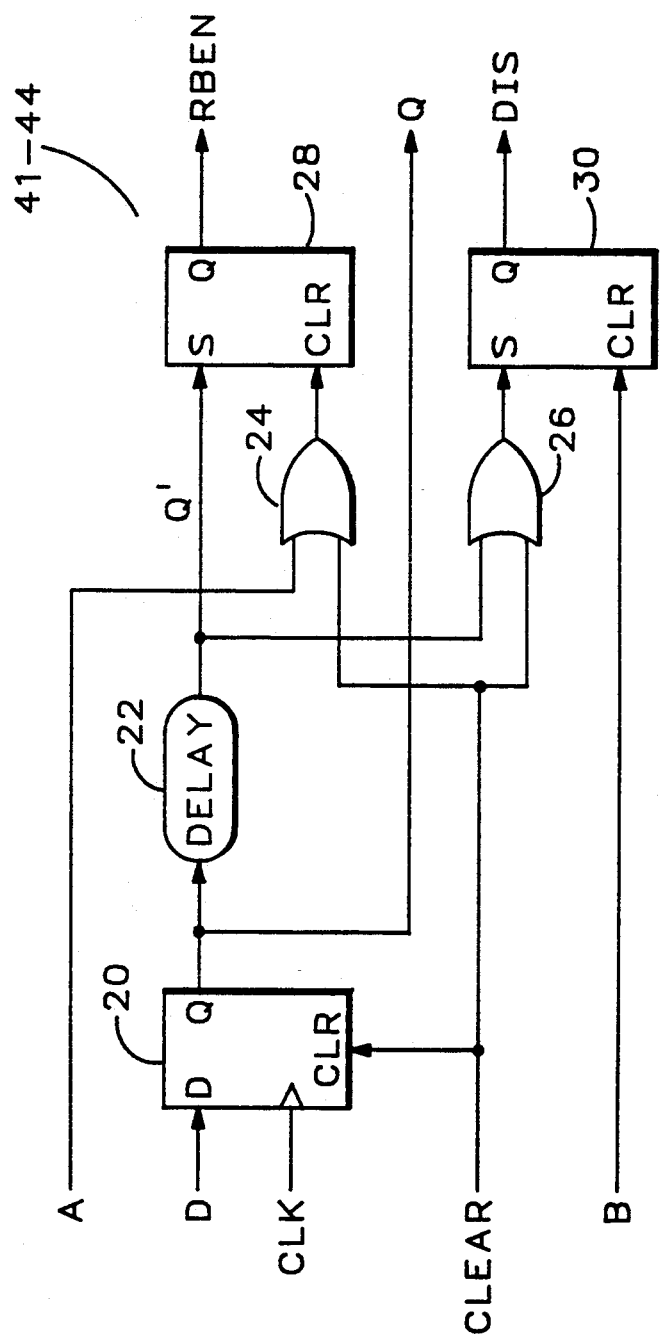
FIG. 8 is a schematic diagram of the control logic circuits used in the system circuit shown in FIG. 7.

Referring now to FIG. 8, the Logic Control circuits 41-44 shown in FIG. 7 each consist of the circuitry shown in this FIGURE. The signal D is the D input to a flip-flop 20. The CLEAR signal goes to the clear input of flip-flop 20, while a system clock CLK goes to its clock input. The Q output of flip-flop 20 goes through a delay element 22, which typically has a value of 2 ns, although the desired value will best be understood from further discussion below. The output of delay element 22, Q', is applied to the S (set) input of an asynchronous latch 28 and to one input of OR gate 26. The other input to OR gate 26 is the CLEAR signal, which also is one of the inputs to another OR gate 24. The other input to OR gate 24 is the input signal A. The output of OR gate 24 is the clear input to latch 28. The output of OR gate 26 is the S (set) input to another asynchronous latch 30. The CLR (clear) input to latch 30 is the input signal B. The Q output of latch 28 is the RBEN (readback enable) signal, while the Q output of latch 30 is the DIS (disable) signal.

Figure 9:
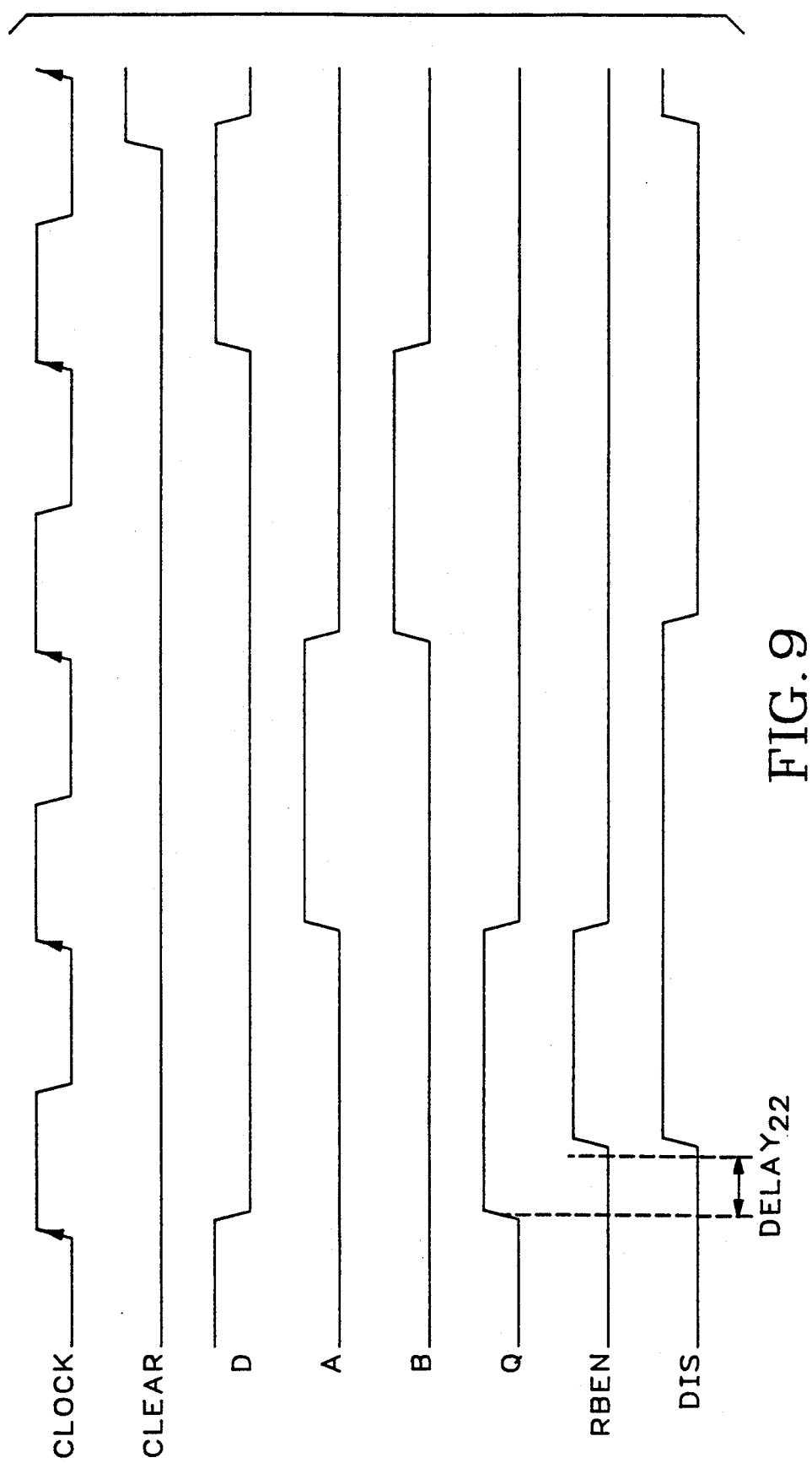
FIG. 9 is a timing diagram illustrating the operation of the control logic circuit shown in FIG. 8.

Referring now to FIG. 9 in conjunction with FIG. 8, the rising edges of a system clock signal, CLOCK, synchronize the behavior of the flip-flops 20 in the four Control Logic circuits 41-44 shown in FIG. 7. The D input to the local flip-flop 20 is the Q output of the flip-flop 20 of the preceding Control Logic circuit. At the beginning of the interval shown in FIG. 9 this D input is high, but it goes low slightly after the active edge of CLOCK. The high D signal at the time of the active CLOCK edge causes the Q output of flip-flop 20 and of the Control Logic circuit 41-44 to go high after the slight propagation delay associated with flip-flop 20. After the delay interval associated with delay element 22, Q' goes high and the output of asynchronous latch 28, RBEN, follows after the short propagation delay of the latch. The positive-going transition of Q' also sets latch 30 after it propagates through OR gate 26 and is felt on the latch's S (set) input, thus also causing DIS to go high. All of the signals in the Control Logic circuit 41-44 then remain in this condition pending the occurrence of the next active edge of the CLOCK signal.

When the next active CLOCK signal occurs the D input to flip-flop 20 is low, and so its Q output goes low shortly thereafter. At the same time that Q goes low, A goes high, since A is the Q output of the next Control Logic circuit 41-44 in the system. The positive-going transition of the A signal is felt through OR gate 24 at the CLR input to latch 28, and in response to the high A signal latch 28's output, RBEN, goes low. This occurs even though the Q' input to the latch is still high because of the delay through delay element 22, since the CLEAR input takes precedence over the set input, S.

Very shortly after the next active CLOCK edge occurs (third one in FIG. 9), the A input goes low and the B input goes high. The low B input clears latch 30, causing DIS to go low a very short time thereafter. All three outputs of the Control Logic circuit 41-44 then normally remain low through another two periods of the system CLOCK. In FIG. 9, however, the CLEAR signal goes active high before the end of the last full CLOCK period shown. When CLEAR goes high, flip-flop 20 is reset, latch 28 is cleared through NOR gate 24, and latch 30 is set through NOR gate 26. Thus, while CLEAR is high, the Q and RBEN signal outputs are held low, while the DIS signal output is held high. The D input also goes low shortly after CLEAR goes high because the Q on the Control Logic circuit 41-44 producing it also went low in response the high CLEAR signal.

Referring now to FIG. 4 in conjunction with FIG. 9, the function of $DELAY_{22}$, the delay produced by the delay element 22, will now be explained in more detail. In anticipation of the following discussion, please note that the time scale of FIG. 9 has approximately a 2:1 ratio to the time scale of FIG. 4. $DELAY_{22}$ shortens both the RBEN signal and the DIS signal, and hence also the RESET signal, since RESET signals are actually RBEN signals from the next Control Logic circuit. The shortening of these signals occurs because their leading, but not trailing, edges are delayed by $DELAY_{22}$.

Since it is the interval during which the disable signal DIS is low that the peak detection circuits shown in FIG. 3 actively monitor their Input signal, a shorter DIS signal lengthens this interval and creates an overlap interval when two peak detection circuits are actively monitoring the same signal. Note in FIG. 7 that alternate pairs of Dual Detect w/ Bias Circuits 41-44, such as #1 and #3 or #2 and #4, monitor the same pair of signals. Then note in FIG. 4 how $DIS_1$ is still low for a brief interval after $DIS_3$ goes low, and how $DIS_2$ remains low for a short interval after $DIS_4$ makes the transition to its low state. This overlap interval is the consequence of $DELAY_{22}$ and its effect is to shorten the DIS signals.

Because of the safety margin provided by this overlap interval, a particular pair of peak detectors (in one Dual Detect w/ Bias Circuit 45-48) can operate ineffectively and miss peaks for a time less than $DELAY_{22}$ without any negative consequence, since the peak detectors in the Dual Detect w/ Bias Circuit monitoring the same signals during the opposite phase of coverage will still be operating during the overlap interval. The newly active peak detector must not produce false peaks, but it may miss actual ones during this interval. The bias generator 18,18' is designed to bring up the differential amplifier stage 10 in such a way that false peaks are not detected, but time is available for transitioning to an effective state before that particular peak detector's operation becomes critical.

The shortening of RBEN keeps it from going active before the corresponding DIS signal goes active disconnecting the active and passive peak holding circuits 12 and 14 from the differential amplifier stage 10. The shorter RESET signal creates a delay (of approximately $DELAY_{22}$) between the end of the readback enable signal RBEN and RESET, thus guaranteeing that data is read out before the capacitors storing it are discharged.

The $OUT_{AX}$ and $OUT_{BX}$ outputs of the Dual Detect w/ Bias Circuits 45–48 are all connected to the HIGH and LOW output lines, respectively. During the time that $RBEN_1$ is active, $OUT_{A1}$ puts the max information derived from the COM line on the HIGH output line and $OUT_{B1}$ puts the max information derived from the NEG line on the LOW output line, so that a difference taken between these two values represents the input signal minimum. During the time that $RBEN_2$ is active, $OUT_{A2}$ puts the max information derived from the POS line on the HIGH output line and $OUT_{B2}$ puts the max information derived from the COM line on the LOW output line, so that a difference taken between these two values represents the input signal maximum. Similarly, during the time that $RBEN_3$ is active, $OUT_{A3}$ puts the max information derived from the COM line on the HIGH output line and $OUT_{B3}$ puts the max information derived from the NEG line on the LOW output line, so that a difference taken between these two values again represents the input signal minimum. And, during the time that $RBEN_4$ is active, $OUT_{A4}$, puts the max information derived from the POS line on the HIGH output line and $OUT_{B4}$ puts the max information derived from the COM line on the LOW output line, so that a difference taken between these two values again represents the input signal maximum. Thus, minimum and maximum values of the input signal are monitored at all times by the system circuit shown in FIG. 7.

The min/max detection system circuit shown in FIG. 7 is calibrated by applying known voltage levels to its input and reading out the results obtained to develop calibration data. This data is then used to control an analog multiplier and adder which are used to adjust the gain and offset of the min/max data before it is converted to digital form. Alternatively, the contents of a lookup table can be used to convert acquired and digitized data into calibrated output after the digital to analog conversion process, as is well known in the art.

It should be noted that a peak detector can be made to be either a positive peak detector or a negative peak detector. A maximum peak detector can be readily converted to a minimum peak detector by substituting PMOS transistors for NMOS transistors, NMOS transistors for PMOS transistors, and reversing the power rails. Channel lengths and widths for the transistors must also be adjusted to compensate for differences in n-channel and p-channel conductivity. Circuit simulation can then be used to optimize the trade-off between speed and power consumption for the needed operating voltage range.

It should also be noted that minimum detectors and maximum detectors can each be made to serve the opposite function by inverting the polarity of the signals applied to their inputs.

While some preferred embodiments of the present invention have been shown and described, it will be apparent to those skilled in the art that many changes and modifications may be made without departing from the invention in its broader aspects. For example, while the implementation shown above has been described as CMOS-compatible and was designed to solve problems that are particularly acute in a CMOS environment, the basic principles of the invention are not limited to CMOS implementations, but would also improve the performance of peak detectors implemented using other types of transistors. The claims that follow are therefore intended to cover all such changes and modifications as fall within the true scope of the invention.

We claim:

1. A peak detection circuit for determining a voltage level extreme of an input signal to be monitored during a time interval comprising:
   a differential amplifier stage (10) for receiving the input signal and producing an amplifier output signal responsive to the difference between an input signal and an extreme value signal;
   an active peak holding circuit (12) for receiving the amplifier output signal and storing an extreme value of the amplifier output signal that occurs during the time interval, the active peak holding circuit (12) producing the extreme value signal from the stored extreme value of the amplifier output signal;
   a passive peak holding circuit (14) for receiving the amplifier output signal and storing a duplicate extreme value of the amplifier output signal that occurs during the time interval, the passive peak holding circuit (14) producing a second extreme value signal from the duplicate stored extreme value of the amplifier output signal.

2. A peak detection circuit according to claim 1 wherein the differential amplifier stage comprises:
   a differential pair of transistors including a first transistor (Q1) and a second transistor (Q2) with one electrode of the first transistor (Q1) and one electrode of the second transistors (Q2) being coupled together, the gate or base of the first transistor (Q1) being controlled by the input signal and the gate or base of the second transistor (Q2) being controlled by the extreme value signal;
   a first current source (Q4) for supplying a first constant current to the coupled electrodes of the differential pair (Q1,Q2); and
   a second current source (Q3) for supplying a second constant current to the second transistor (Q2), the second constant current being approximately one half of the first constant current, with the amplifier output signal being produced at a node between the second transistor (Q2) and the second current source (Q3).

3. A peak detection circuit according to claim 2 further comprising a bias signal generator (18,18') coupled to supply bias signals to the first and second current sources (Q4,Q3).

4. A peak detection circuit according to claim 3 wherein the differential amplifier stage (10) is only active when the first and second transistors (Q1,Q2) are supplied with suitable bias signals and the suitable bias signals are only supplied during the time interval.

5. A peak detection circuit according to claim 1 further comprising a output amplifier stage (16) for receiving the second extreme value and producing an output signal indicative thereof.

6. A peak detection circuit according to claim 5 wherein the output amplifier stage (16) comprises a voltage follower.

7. A peak detection circuit according to claim 1 further comprising control logic for supplying a disable signal, the disable signal being inactive during the time interval and active during times outside of the time interval, and functioning to disconnect the active peak holding circuit (12) and passive peak holding circuit (14) from the differential amplifier stage (10) when active.

8. A peak detection circuit according to claim 7 wherein the control logic also generates a reset signal, the reset signal being active during a portion of the time that the disable signal is active and causing the extreme value stored by the active peak holding circuit (12) and the duplicate extreme value stored by the passive peak holding circuit (14) to be discharged.

9. A peak detection circuit according to claim 7 further comprising an output amplifier stage (16) for receiving the second extreme value signal and producing an output signal indicative of the second extreme value signal, wherein the control logic also produces a readback enable signal during a portion of the time that the disable signal is active, the readback enable signal being coupled to cause production of the output signal.

10. A peak detection circuit according to claim 1 wherein the active peak holding circuit (12) comprises:
diode means (Q5) coupled to receive the amplifier output signal at a forward end and producing the extreme value signal at a reverse end;
capacitance means (C1) coupled to the reverse end of the diode means (Q5) for storing a charge representing the extreme value; and
switch means (Q7) for discharging the charge in accordance with a reset signal.

11. A peak detection circuit according to claim 1 wherein the passive peak holding circuit (14) comprises:
diode means (Q6) coupled to receive the amplifier output signal at a forward end and producing the second extreme value signal at a reverse end;
capacitance means (C2) coupled to the reverse end of the diode means (Q6) for storing a charge representing the duplicate extreme value; and
switch means (Q8) for discharging the charge in accordance with a reset signal.

12. A system level peak detection circuit for continuously determining an extreme voltage level of a differential input signal to be monitored, the differential input signal being represented by a positive signal, a common signal, and a negative signal, the circuit comprising:

a first pair of peak detection circuits (45) disposed to monitor the common signal and the negative signal during a first active time interval and producing a high output representing the peak activity of the common signal and a low output representing the peak activity of the negative signal;
a second pair of peak detection circuits (46) disposed to monitor the positive signal and the common signal during a second active time interval and producing a high output representing the peak activity of the positive signal and a low output representing the peak activity of the common signal;
a third pair of peak detection circuits (47) disposed to monitor the common signal and the negative signal during a third active time interval and producing a high output representing the peak activity of the common signal and a low output representing the peak activity of the negative signal;
a fourth pair of peak detection circuits (48) disposed to monitor the positive signal and the common signal during a fourth active time interval and producing a high output representing the peak activity of the positive signal and a low output representing the peak activity of the common signal; and
control logic means (40, 41-44) for providing control signals to each pair of peak detection circuits (45-48), so that the first and third active time intervals are approximately of opposite phase and the second and fourth active time intervals are approximately of opposite phase.

13. A circuit according to claim 12 wherein each active time interval has a duty cycle of activity longer than fifty percent so that a period of overlap in the monitoring of the input signal is provided.

14. A circuit according to claim 12 wherein each pair of peak detectors (45-48) has an associated bias generation circuit (18,18').

15. A circuit according to claim 12 wherein the control logic means (40, 41-44) comprises four control logic circuits (41-44) each of which is associated with one of the first through fourth pair of peak detection circuits (45-48)

16. A circuit according to claim 15 wherein each control logic circuit (41-44) produces a disable signal and a readback enable signal, and each pair of peak detection circuits (45-48) operates in accordance with a disable signal from the associated control logic circuit, a readback enable signal from the associated control logic circuit, and a reset signal that is the readback enable signal from the logic circuit associated with a next pair of peak detection circuit.

17. A circuit according to claim 15 wherein each control logic circuit (41-44) produces a synchronization signal ($Q_x$) that is used to initiate a cycle of activity in a next control logic circuit.

* * * * *